United States Patent
Joshi et al.

(10) Patent No.: US 8,084,297 B1
(45) Date of Patent: Dec. 27, 2011

(54) METHOD OF IMPLEMENTING A CAPACITOR IN AN INTEGRATED CIRCUIT

(75) Inventors: Mukul Joshi, Mountain View, CA (US); Kumar Nagarajan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/851,522

(22) Filed: Aug. 5, 2010

Related U.S. Application Data (62) Division of application No. 11/340,996, filed on Jan. 27, 2006, now Pat. No. 7,791,192.

(51) Int. Cl.
*H01L 21/00* (2006.01)

(52) U.S. Cl. ........ 438/106; 257/499; 257/528; 257/532; 257/685; 257/704; 257/724; 257/778; 257/E23.079; 257/E23.116; 257/E23.124; 257/E23.141; 257/E23.153; 257/E23.154; 438/107; 438/108; 438/109; 438/110

(58) Field of Classification Search ................ 257/499, 257/528, 532, 685, 704, 724, 778, E23.079, 257/E23.116, E23.124, E23.141, E23.153, 257/E23.154; 438/106–112
See application file for complete search history.

(56) References Cited

U.S. PATENT DOCUMENTS

| | | | |
|---|---|---|---|
| 4,617,479 A | 10/1986 | Hartmann et al. | |
| 5,798,567 A * | 8/1998 | Kelly et al. | 257/723 |
| 6,229,215 B1 | 5/2001 | Egawa | |
| 6,384,701 B1 | 5/2002 | Yamada et al. | |
| 6,661,100 B1 | 12/2003 | Anderson et al. | |
| 6,906,408 B2 * | 6/2005 | Cloud et al. | 257/686 |
| 7,067,914 B2 | 6/2006 | Malinowski et al. | |
| 7,109,576 B2 * | 9/2006 | Bolken et al. | 257/686 |
| 2002/0086500 A1 * | 7/2002 | Wu et al. | 438/455 |
| 2002/0140085 A1 * | 10/2002 | Lee et al. | 257/724 |
| 2003/0033578 A1 | 2/2003 | Chan et al. | |
| 2004/0012085 A1 | 1/2004 | Shioga et al. | |
| 2004/0075170 A1 * | 4/2004 | Degani et al. | 257/724 |
| 2004/0164390 A1 * | 8/2004 | Wang | 257/686 |
| 2005/0179128 A1 * | 8/2005 | Shioga et al. | 257/724 |
| 2005/0258548 A1 | 11/2005 | Ogawa et al. | |
| 2005/0285243 A1 * | 12/2005 | Stone et al. | 257/678 |

OTHER PUBLICATIONS

U.S. Appl. No. 11/340,996, filed Jan. 27, 2006, Joshi et al.

* cited by examiner

*Primary Examiner* — Meiya Li
(74) *Attorney, Agent, or Firm* — John J. King; Thomas George (57) ABSTRACT

A method of implementing a capacitor in an integrated circuit package is disclosed. The method comprises coupling the capacitor to a first surface of a substrate of the integrated circuit package; positioning an integrated circuit die over the capacitor, wherein the integrated circuit die has a first plurality of solder bumps and a second plurality of solder bumps separated by a region having no solder bumps; coupling the integrated circuit die to the first surface of the substrate over the capacitor, wherein the region having no solder bumps is positioned over the capacitor; and encapsulating the integrated circuit die and the capacitor.

20 Claims, 7 Drawing Sheets

-- Prior Art --

FIG. 1

-- Prior Art --

FIG. 2

-- Prior Art --

METHOD OF IMPLEMENTING A CAPACITOR IN AN INTEGRATED CIRCUIT

FIELD OF THE INVENTION

The present application relates generally to integrated circuit packages, and in particular, to a method of implementing a capacitor in an integrated circuit package.

BACKGROUND OF THE INVENTION

As the integrated circuits (ICs) continue to become smaller in size, and the circuitry on ICs continue to increase, the density of bonds and the number of bonds continue to increase. A ball grid array (BGA) is an advanced integrated circuit package comprising a substrate having contacts on the bottom for soldering the integrated circuit package to a circuit board. A wire bond BGA comprises a die having contact pads which are bonded to a contact pads on the surface of the substrate by way of wire bonds. In contrast, a flip chip BGA comprises a die having contact pads which are directly bonded to the substrate using solder bumps. Unlike in a wire bond BGA, the die having solder bumps is flipped over and placed face down in a flip chip BGA, with the solder bumps connecting directly to corresponding contact pads on the top surface of the substrate. The contact pads on the bottom of the substrate of either type of package are ultimately soldered to a circuit board.

Flip chip packages are particularly useful with devices requiring a large number of pins, such as programmable logic devices (PLDs). A PLD is an integrated circuit designed to be programmed by users so that users may implement logic designs of their choices. One type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA.

Figure 1:
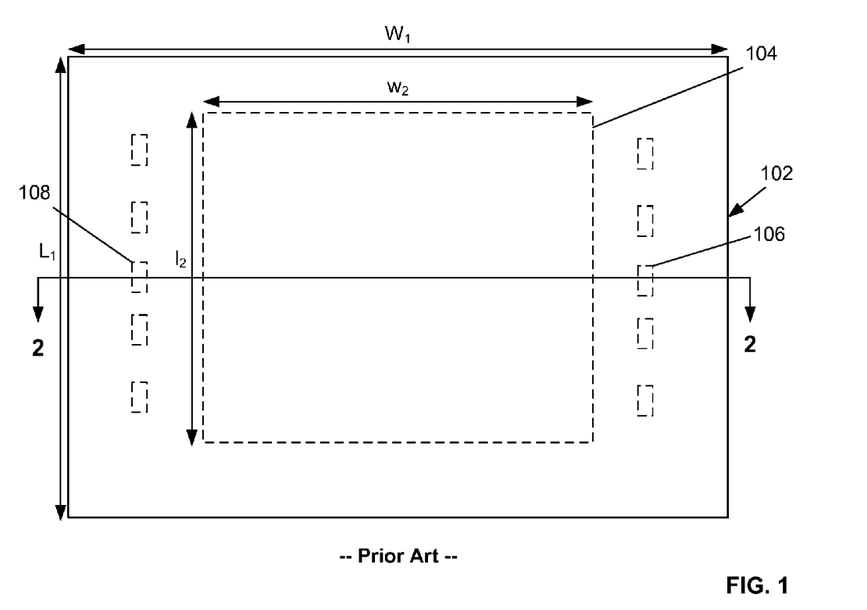
FIG. 1 is a top plan view of conventional integrated circuit package having an integrated circuit die and capacitors coupled to a substrate.

However, as both the density of the circuitry and the amount of circuitry for a given integrated circuit continues to increase, the noise associated with circuitry continues to increase. This unwanted noise is a particular problem in programmable logic devices because of the switching of digital circuits and high density of interconnect lines. In order for the circuit to operate properly, it is important to effectively control noise generated internally from digital switching. One way to control such noise is through the use of decoupling capacitors. As shown for example in the conventional integrated circuit package 102 of FIG. 1 having an integrated circuit die 104 (and the cross-sectional view of FIG. 2 taken at lines 2-2), the decoupling capacitors 106 and 108 are positioned on the substrate on the sides of the integrated circuit die 104, which has dimensions $w_2$ and $l_2$. Although the decoupling capacitors are shown on two sides of the integrated circuit die, the decoupling capacitors may be positioned on any number of sides, including all four sides, therefore affecting the overall size of the integrated circuit package by affecting both dimension $W_1$ and $L_1$.

The goal of decoupling is to provide a low impedance path between the point in the supply system where a logic element on the integrated circuit draws the current needed to operate and its local ground contact, forming the return path for current to the power supply. Placing a capacitor in close proximity to the power and ground contacts on the integrated circuit takes RF energy generated by rapid changes of current demand on the power supply during switching, and then channels it to the ground return path. The use of decoupling capacitors prevents power line channeled noise from subverting normal circuit operation. Because uncontrolled power supply noise has many effects, such as intermodulation and crosstalk, it is important to reduce noise whenever possible in digital circuits.

Figure 2:
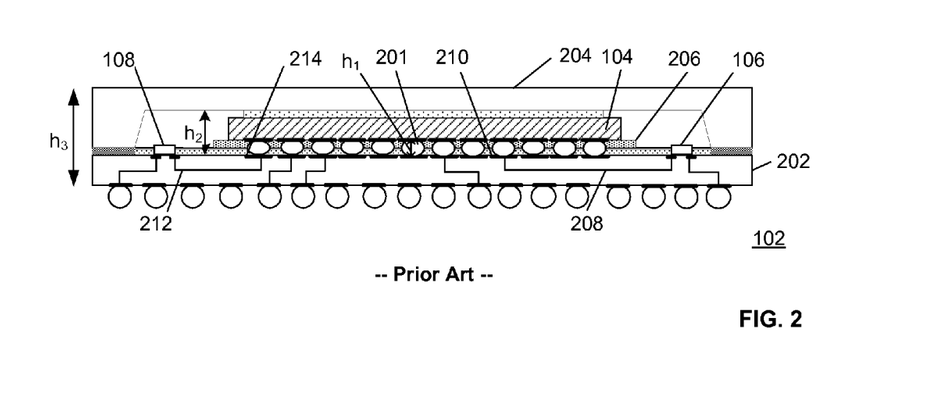
FIG. 2 is a cross-sectional view of the integrated circuit package of FIG. 1 taken at lines 2-2.
Figure 3:
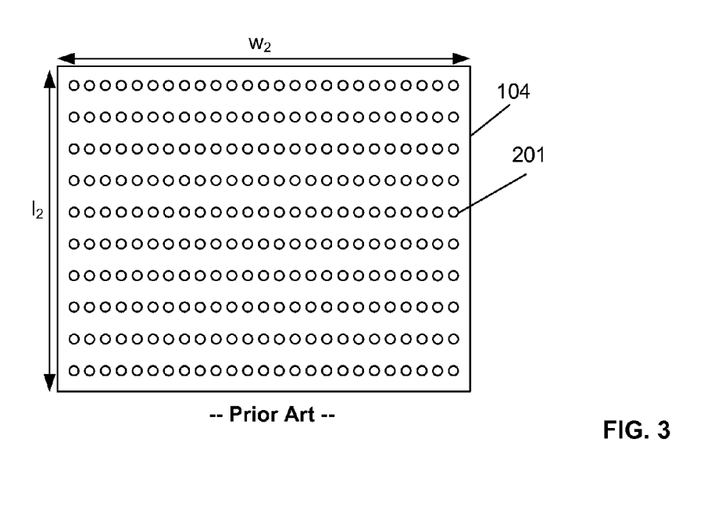
FIG. 3 is a bottom plan view of the integrated circuit die of the integrated circuit package of FIG. 1.

However, decoupling capacitors themselves may cause undesirable affects in the circuit. Decoupling capacitors are typically placed on periphery of the substrate, typically as close to the integrated circuit die as possible. In an integrated circuit package, a flip chip with solder bumps 201 having a height $h_1$ is positioned on a substrate 202 which is coupled to a lid 204. The inside of the lid extends a height $h_2$ from the substrate, resulting in an overall height of $h_3$ for the integrated circuit package. As can also be seen in the bottom plan view of the integrated circuit die of FIG. 3, the solder bumps 201 are evenly positioned over the entire area of the die. The proximity of the capacitors from the integrated circuit die 104 is constrained by the die size and the underfill 206. The conducting metal lines in the substrate connect the capacitors and the power/ground pins of the chip. The inductance of these metal lines is directly proportional to the length of the conductive path. As can be seen in FIG. 2, the conductor 208 from a power or ground contact 210 of the die to the decoupling capacitor 106 may be particularly long. Even when the power or ground contact on the die is on the end of the die, the line may be relatively long, as shown by conductor 212 connecting contact 214 to the decoupling capacitor 108. Accordingly, the benefits of placing capacitors on the substrate to minimize the simultaneous switching noise (SSO) between the power/ground planes is overshadowed by the inductance of the conductive path between the capacitor and the integrated circuit die.

SUMMARY OF THE INVENTION

A method of implementing a capacitor in an integrated circuit package is disclosed. The method comprises coupling the capacitor to a first surface of a substrate of the integrated circuit package; positioning an integrated circuit die over the capacitor, wherein the integrated circuit die has a first plurality of solder bumps and a second plurality of solder bumps separated by a region having no solder bumps; coupling the integrated circuit die to the first surface of the substrate over the capacitor, wherein the region having no solder bumps is positioned over the capacitor; and encapsulating the integrated circuit die and the capacitor.

According to an alternate embodiment, a method of implementing a capacitor in an integrated circuit package comprises coupling the capacitor to a first surface of a substrate of the integrated circuit package; positioning a flip chip die having a plurality of solder bumps on the substrate, the plurality of solder bumps creating separation between a bottom of the flip chip die and the capacitor; reflowing the plurality of solder bumps during an assembly reflow process; and maintaining a separation between the bottom of the flip chip die and the capacitor after reflowing the plurality of solder bumps.

According to a further embodiment, a method of implementing a capacitor in an integrated circuit package comprises coupling the capacitor to a first surface of a substrate of the integrated circuit package; positioning an integrated circuit die over the capacitor, wherein the integrated circuit die has a bus having power and ground conductors extending along a region of the integrated circuit die having no solder bumps; coupling the integrated circuit die to the first surface of the substrate over the capacitor, wherein the region of the integrated circuit die having no solder bumps is positioned over the capacitor; and encapsulating the integrated circuit die and the capacitor.

DETAILED DESCRIPTION OF THE DRAWINGS

Figure 4:
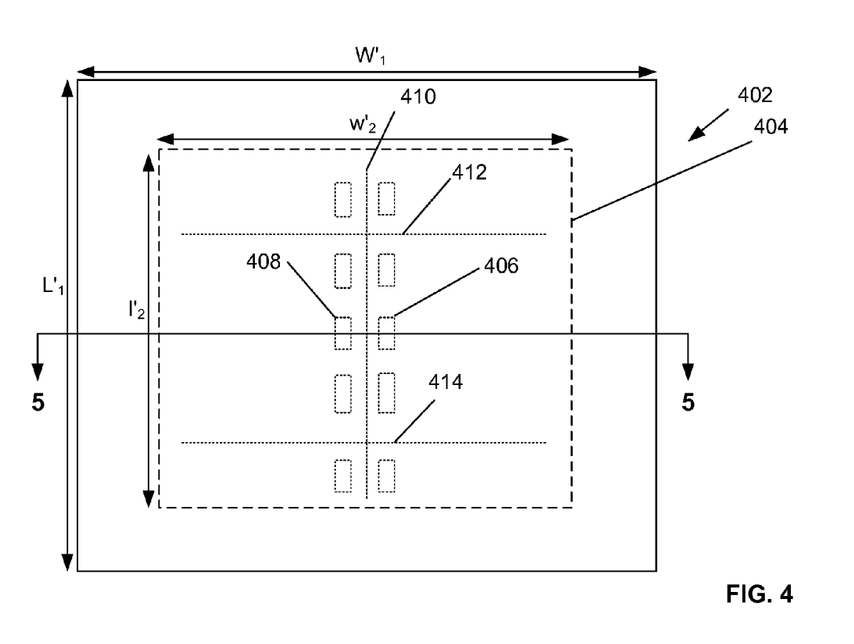
FIG. 4 is a top plan view of an integrated circuit package having an integrated circuit die and capacitors coupled to a substrate according to an embodiment of the present invention.

Turning first to FIG. 4, a top plan view of an integrated circuit package 402 having an integrated circuit die 404 and capacitors 406 and 408 coupled to a substrate according to an embodiment of the present invention is shown. As can be seen and will be described in more detail in reference to the cross section of FIG. 5, the capacitors are coupled to the substrate under the integrated circuit die. Also shown is a conductor 410 associated with the die, which may be for example a bus having a plurality of conductors including power and ground conductors, and the capacitors may be used as decoupling capacitors. The die may further include additional conductors 412 and 414 for routing signals, such as power and signals, to other parts of the integrated circuit die. Because the capacitors are positioned under the integrated circuit die, the width $W'_1$ of the overall integrated circuit package may be reduced compared to the width $W_1$ of the conventional circuit of FIG. 1. That is, the area of the substrate for receiving the decoupling capacitors is not necessary in the embodiment of FIG. 4.

By placing the decoupling capacitors closer to the power or ground conductors of the integrated circuit, the circuit of FIG. 4 further provides an enhanced electrical performance by reducing the distance from the decoupling capacitor and the power or ground contact on the substrate. According to one aspect of the circuit, the decoupling capacitors may be placed directly under the chip in as close proximity to a power or ground contact of the die as possible. Although the circuit of FIG. 4 shows the decoupling capacitors in the center of the die by way of example, the decoupling capacitors may be placed at any location under the die which will reduce the distance from a lead of the decoupling capacitor to a power or ground contact of the die. Also, although two rows of decoupling capacitors are shown, individual decoupling capacitors or other groups of capacitors may be employed at any location of the substrate near corresponding power and ground contacts on the die.

Figure 5:
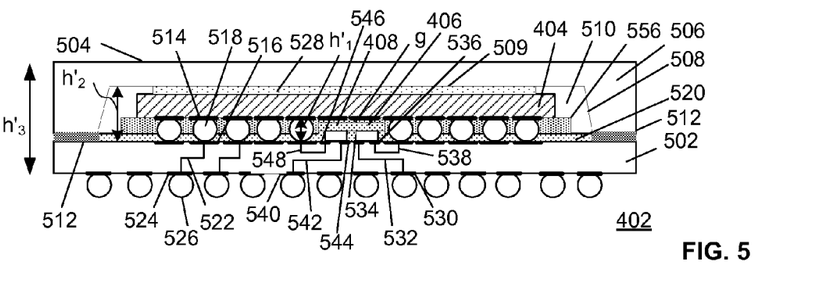
FIG. 5 is a cross-sectional view of the integrated circuit package of FIG. 4 taken at lines 5-5 according to an embodiment of the present invention.

Turning now to FIG. 5, a cross-sectional view of the integrated circuit package of FIG. 4 taken at lines 5-5 according to an embodiment of the present invention is shown. As shown in FIG. 5, a substrate 502 is coupled to receive a lid 504 comprising side walls 506 having an inner surface 508. An inner top surface 509 and the inner side walls 508 form a recessed area 510 for encapsulating the integrated circuit die 404 and the capacitors 406 and 408. The lid 504 is coupled to the substrate by way of a bonding agent 512. The lid may be any type for conventional lid of an integrated circuit package, and may be a heat conductive material. The bonding agent may an adhesive material or a solder, or some other suitable material for attaching the lid to the substrate.

Contact pads 514 of the integrated circuit die are coupled to corresponding contact pads 516 on the substrate by solder bumps 518. High lead (Pb) solder bumps, which provide an increased gap (i.e., stand-off height) between the chip and the substrate, are preferably used to accommodate the height of the capacitors under the flip chip die. That is, high lead solder bumps do not shrink significantly during reflow, and therefore maintain the separation (designated as gap "g") from the bottom of the die and the capacitors. An example of high-Pb solder is solder having a composition of approximately 95 percent Pb and 5 percent tin (Sn). However, it should be understood that any solder or other conductive material that will maintain a gap between the die and the capacitors may be used. As can be seen in FIG. 5 and as will be described in more detail in reference to FIG. 9, a mask layer 520 is applied over the capacitors 406 and 408, filling at least a portion of the gap "g."

Also shown in FIG. 5 is the substrate conductors comprising a plurality of conductors extending from contact pads on the top of the substrate to contact pads on the bottom of the substrate. For example, a conductor 522 extends from the contact pad 516 to the contact pad 524 on the bottom of the substrate. Finally, solder balls 526 are positioned on the bottom of the substrate. Although some conductors and contacts of the substrate in the cross section of FIG. 5 are shown by way of example, many conductors connect the contact pads on the top of the substrate to contact pads on the bottom of the substrate according to substrate artwork created for the substrate. The substrate artwork defines the various conductors so that the proper connections are made from the contact pads of the integrated circuit die (by way of the solder bumps and contact pad on the top of the substrate) to the contacts on the bottom of the substrate.

According to one aspect of the embodiment of FIG. 5, the decoupling capacitors 406 and 408 are positioned near power or ground contacts of the integrated circuit die so that a conductor of the substrate connecting a lead of a decoupling capacitor to a power or ground contact of the integrated circuit die is minimized. For example, a first contact pad 530 on the bottom of the substrate is coupled by a conductor 532 to a contact pad 534 on the top of the substrate. The contact pad 534 is coupled to a lead of the capacitor 406. However, as can be seen, the contact pads for the capacitor 406 (and particularly the contact pad 536) are positioned so that the length of the conductive path 538 between the capacitor and a ground contact pad (e.g., contact pad 536) of the integrated circuit die associated with a ground contact of the integrated circuit also is minimized. Similarly, a second contact pad 540 on the bottom of the substrate is coupled by a conductor 542 to a contact pad 544 on the top of the substrate. The contact pad 544 is coupled to a lead of the capacitor 408. A contact pad 546 for the capacitor 408 is positioned so that the length of the conductive path 548 between the capacitor and a contact pad (e.g., contact pad 546) of the integrated circuit die associated with a power contact of the integrated circuit die is minimized. As described above, minimizing the length of the conductive path improves electrical performance. In contrast to the embodiment of FIG. 5 where the solder mask layer 520 covers the capacitors 406 and 408, openings or recesses may be created in the solder mask so that the capacitors having solder bumps may be coupled to the contact pads of substrate through the openings according to the alternate embodiment of FIG. 6. The formation of integrated circuit packages of FIGS. 5 and 6 will be described in more detail in reference to FIGS. 9 and 10.

Figure 6:
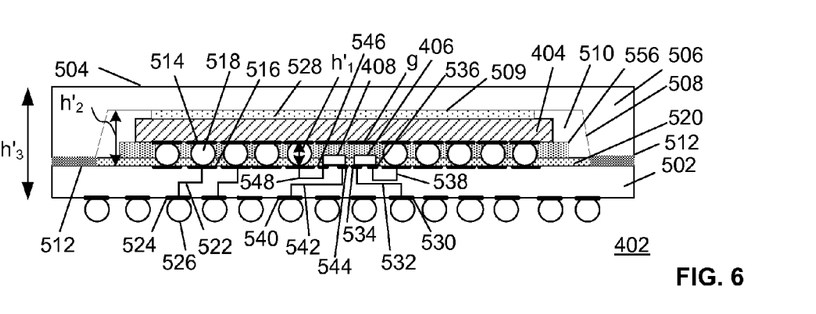
FIG. 6 is a cross-sectional view of the integrated circuit package of FIG. 4 taken at lines 5-5 according to an alternate embodiment of the present invention.
Figure 7:
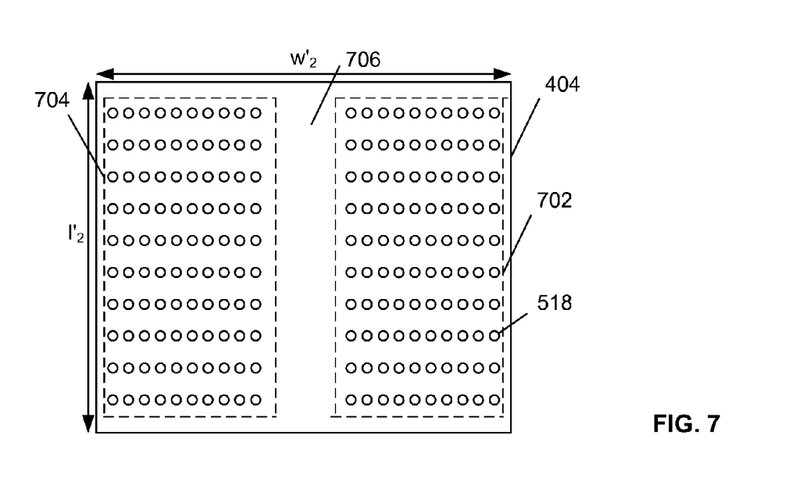
FIG. 7 is a bottom plan view of the integrated circuit die of the integrated circuit package of FIG. 1 according to an embodiment of the present invention.

Turning now to FIG. 7, a bottom plan view of the die of the integrated circuit package of FIGS. 5 and 6 according to an embodiment of the present invention is shown. As is shown, the contact pads and solder bumps on a surface of the integrated circuit die are formed to accommodate the capacitors 406 and 408. In particular, substrate 404 comprises a first region 702 of solder bumps 518 and a second region 704 of solder bumps on either side of a region 706 having no solder bumps. That is, region 706 provides a recess for receiving the capacitors when the integrated circuit die is attached to the substrate. Although the two regions of solder bumps and the one recess are shown by way of example, any number of regions having no solder bumps, having any shape, may be formed such that decoupling capacitors on the substrate are positioned close to power and ground contacts on the integrated circuit die.

Figure 8:
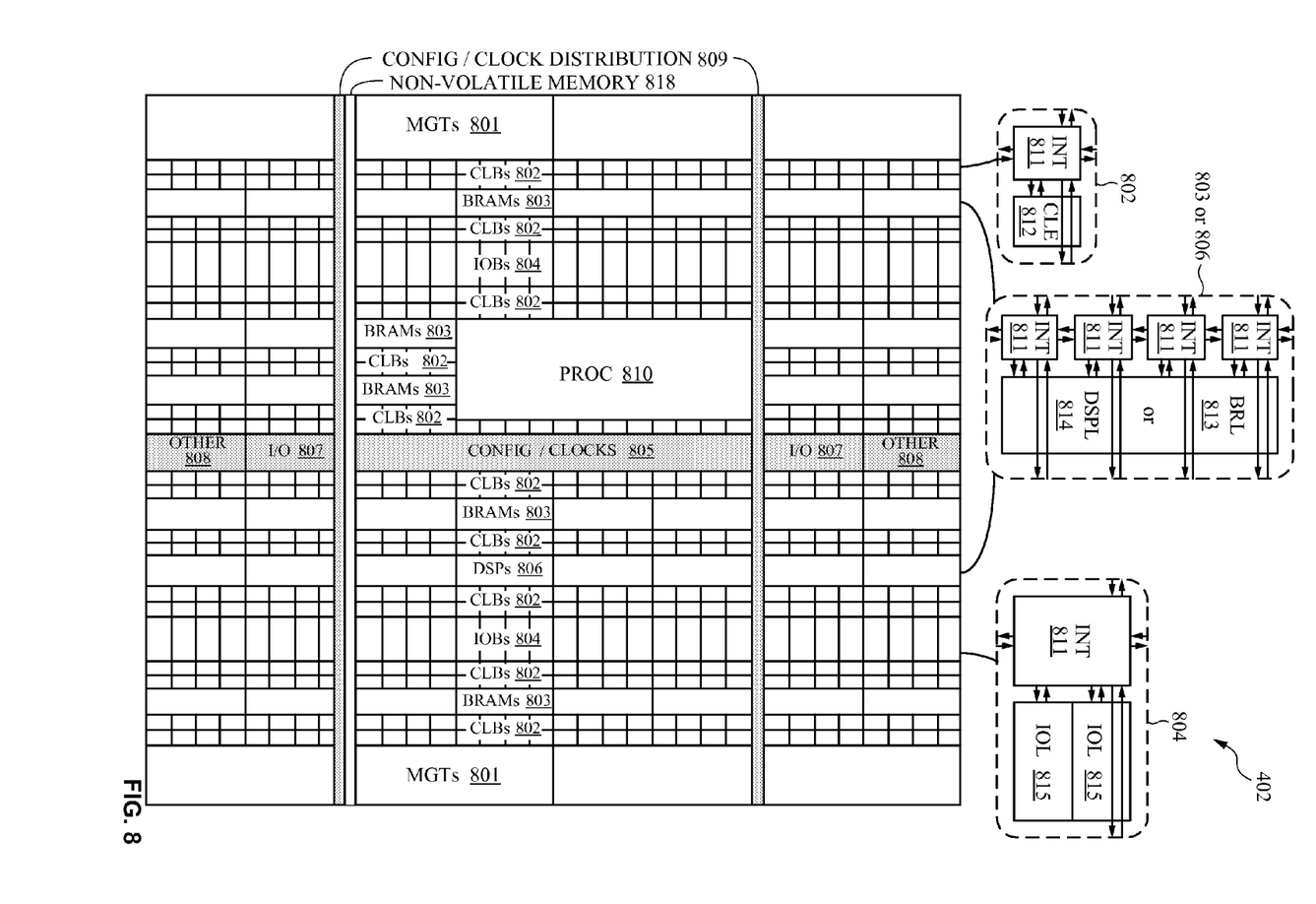
FIG. 8 is a block diagram of a programmable logic device implemented in an integrated circuit die of FIG. 6 according to an embodiment of the present invention.

Turning now to FIG. 8, a block diagram of a programmable logic device implemented in an integrated circuit die 402 and substrate 502 according to an embodiment of the present invention is shown. In particular, advanced FPGAs may include several different types of programmable logic blocks in the array. For example, FIG. 8 illustrates an FPGA architecture that includes a large number of different programmable tiles including multi-gigabit transceivers (MGTs 801), configurable logic blocks (CLBs 802), random access memory blocks (BRAMs 803), input/output blocks (IOBs 804), configuration and clocking logic (CONFIG/CLOCKS 805), digital signal processing blocks (DSPs 806), specialized input/output blocks (I/O 807) (e.g., configuration ports and clock ports), and other programmable logic 808 such as digital clock managers, analog-to-digital converters, system monitoring logic, and so forth. Some FPGAs also include one or more dedicated processor blocks (PROC 810).

In some FPGAs, each programmable tile includes a programmable interconnect element (INT 811) having standardized connections to and from a corresponding interconnect element in each adjacent tile. Therefore, the programmable interconnect elements taken together implement the programmable interconnect structure for the illustrated FPGA. The programmable interconnect element (INT 811) also includes the connections to and from the programmable logic element within the same tile, as shown by the examples included at the top of FIG. 8.

For example, a CLB 802 may include a configurable logic element (CLE 812) that may be programmed to implement user logic plus a single programmable interconnect element (INT 811). A BRAM 803 may include a BRAM logic element (BRL 813) in addition to one or more programmable interconnect elements. Typically, the number of interconnect elements included in a tile depends on the height of the tile. In the pictured embodiment, a BRAM tile has the same height as four CLBs, but other numbers (e.g., five) may also be used. A DSP tile 806 may include a DSP logic element (DSPL 814) in addition to an appropriate number of programmable interconnect elements. An IOB 804 may include, for example, two instances of an input/output logic element (IOL 815) in addition to one instance of the programmable interconnect element (INT 811). As will be clear to those of skill in the art, the actual I/O pads connected, for example, to the I/O logic element 815 are manufactured using metal layered above the various illustrated logic blocks, and typically are not confined to the area of the input/output logic element 815.

In the pictured embodiment, a columnar area near the center of the die (shown shaded in FIG. 8) is used for configuration, clock, and other control logic. Horizontal areas 809 extending from this column are used to distribute the clocks and configuration signals across the breadth of the FPGA. Some FPGAs utilizing the architecture illustrated in FIG. 8 include additional logic blocks that disrupt the regular columnar structure making up a large part of the FPGA. The additional logic blocks may be programmable blocks and/or dedicated logic. For example, the processor block PROC 810 shown in FIG. 8 spans several columns of CLBs and BRAMs.

Note that FIG. 8 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 8 are purely exemplary. For example, in an actual FPGA more than one adjacent column of CLBs is typically included wherever the CLBs appear, to facilitate the efficient implementation of user logic. Similarly the circuits and methods of the present invention may be implemented in any integrated circuit device, including any type of programmable logic device.

Turning now to FIG. 9, a series of figures shows the assembly of an integrated circuit package according to an embodiment of the present invention. In particular, a substrate 502 is formed comprising a plurality of contacts on the top surface and a plurality of contacts on the bottom surface, and conductors according to substrate artwork coupling predetermined contacts on the top surface to corresponding contacts on the bottom surface. Conductors 522, 532, 538, 542, and 548 described above are shown in FIG. 9a. Solder bumps of the capacitors 406 and 408 are coupled to corresponding contact pads 534 and 536 and contact pads 544 and 546, respectively, as shown in FIG. 9b. A mask layer 520 is then applied over the entire surface, including the capacitors 406 and 408, and the solder mask is etched to create openings for solder bumps of the integrated circuit die, as shown in FIG. 9c. The integrated circuit die is then attached to the substrate, as shown in FIG. 9d. The solder mask may be etched to retain portions of the material over the capacitors, as shown in the embodiment of FIG. 5. Alternatively, the solder mask may be etched to eliminate the material over the capacitors, resulting in the embodiment of FIG. 6.

Figure 9A:
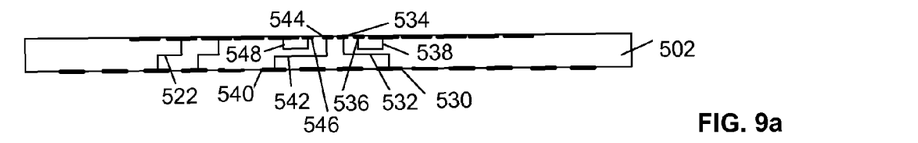
FIG. 9 is a series of figures showing the assembly of an integrated circuit package according to an embodiment of the present invention.
Figure 9B:
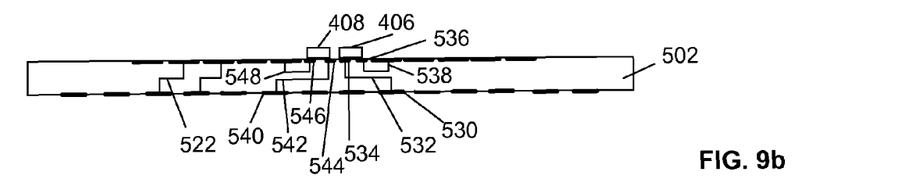
Figure 9C:
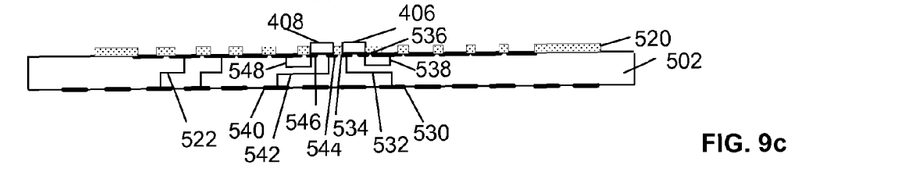
Figure 9D:
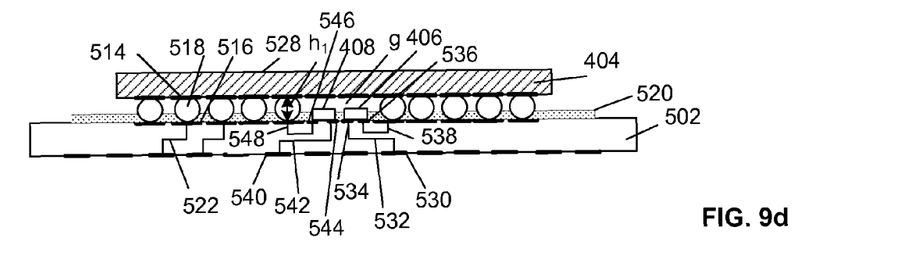
Figure 9E:
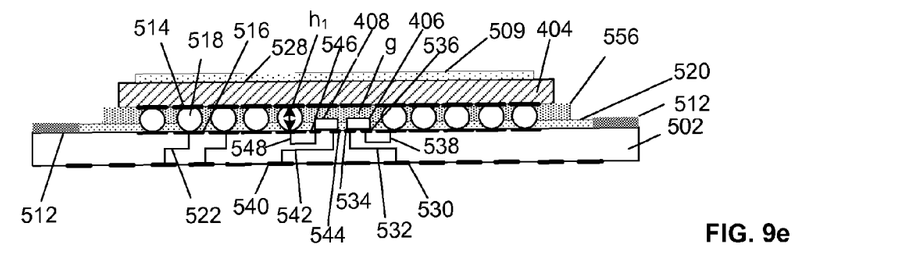
Figure 9F:
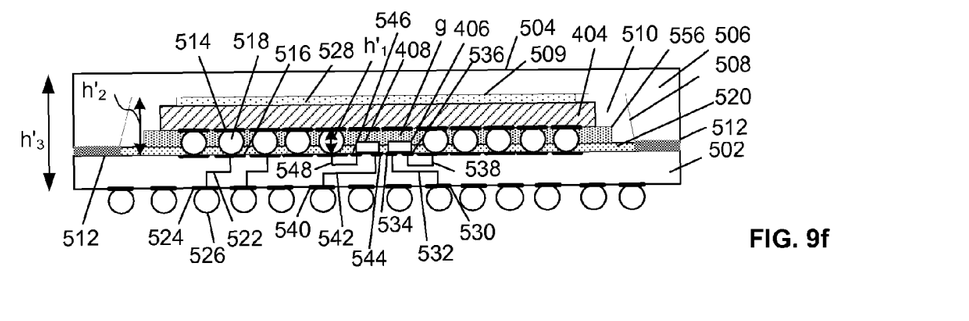
Figure 10A:
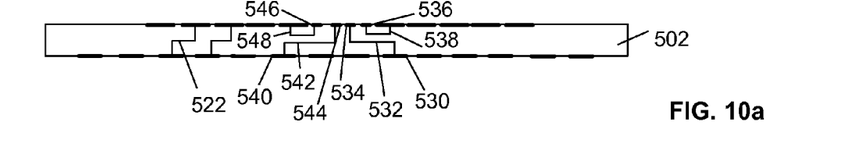
FIG. 10 is a series of figures showing the assembly of an integrated circuit package according to an alternate embodiment of the present invention.
Figure 10B:
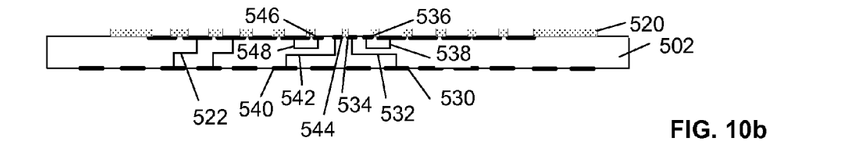
Figure 10C:
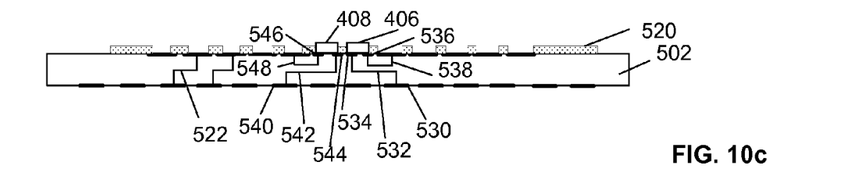
Figure 10D:
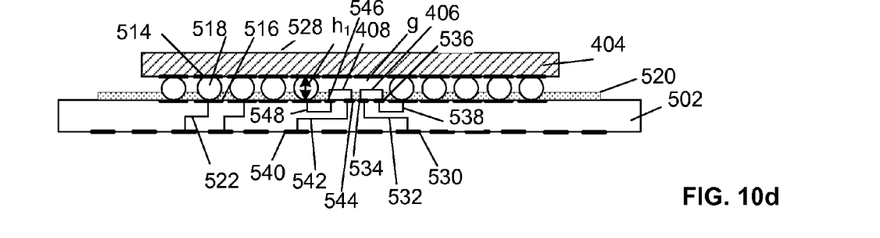
Figure 10E:
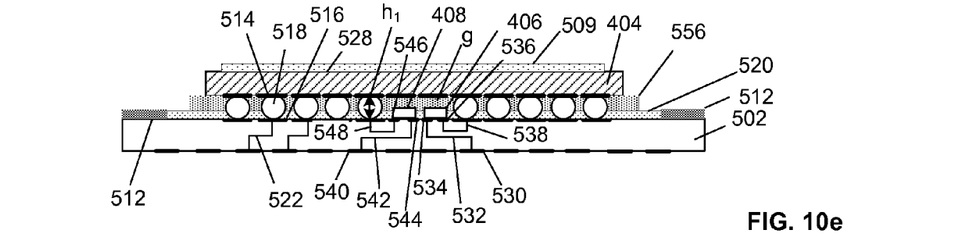
Figure 10F:
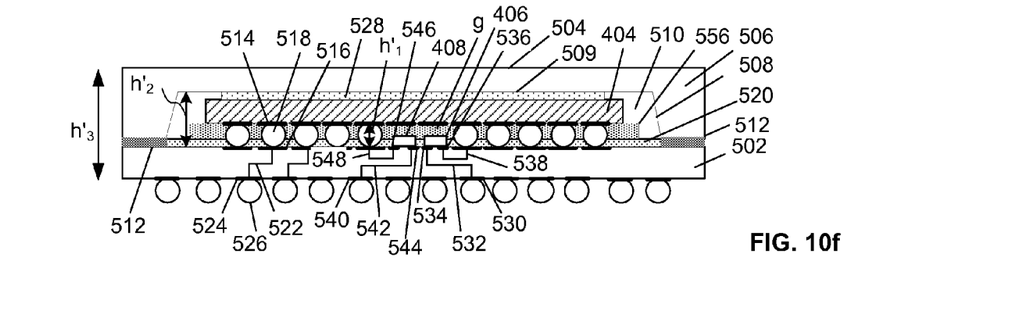

Remaining layers for creating the integrated circuit package are applied, as shown in FIG. 9e. For example, an underfill layer 556 and bonding agents for attaching the lid to the substrate may be applied. The bonding agents may include the adhesive 509 on the top of the integrated circuit die, and adhesive layer 512 on the substrate for attaching a foot portion of the lid to the substrate. Alternatively, solder or some other suitable bonding agent may be used. Finally, the lid is attached to the bonding agent and solder balls are attached to contact pads on the bottom of the substrate, as shown in FIG. 9f. As can be seen, the gap "g" is maintained after any reflowing process for reflowing solder bumps used in the integrated circuit package. Although the height may change after reflowing, as indicated by the reduced height $h'_1$ (of FIG. 9f) compared to $h_1$ (of FIG. 9e), a gap is still maintained.

Turning now to FIG. 10, a series of figures show the assembly of an integrated circuit package according to an alternate embodiment of the present invention. According to the embodiment of FIG. 10 used to create the integrated circuit package shown in FIG. 6, the capacitors 406 and 408 are not attached until the solder mask layer 520 has been applied and etched, as shown in FIG. 10b. After the decoupling capacitors are attached (as shown in FIG. 10c) and the integrated circuit die is attached in FIG. 10d, the gap "g" is maintained by the solder bumps and filled with the underfill 556. By way of example, a chip capacitor may be approximately 300-400 microns in height. Accordingly, the solder balls must be selected to allow room for the capacitors, and preferably create a gap between the bottom of the die and the capacitors. The gap may be, for example, 50 microns, requiring the solder balls to create a height between 350-450 microns.

Figure 11:
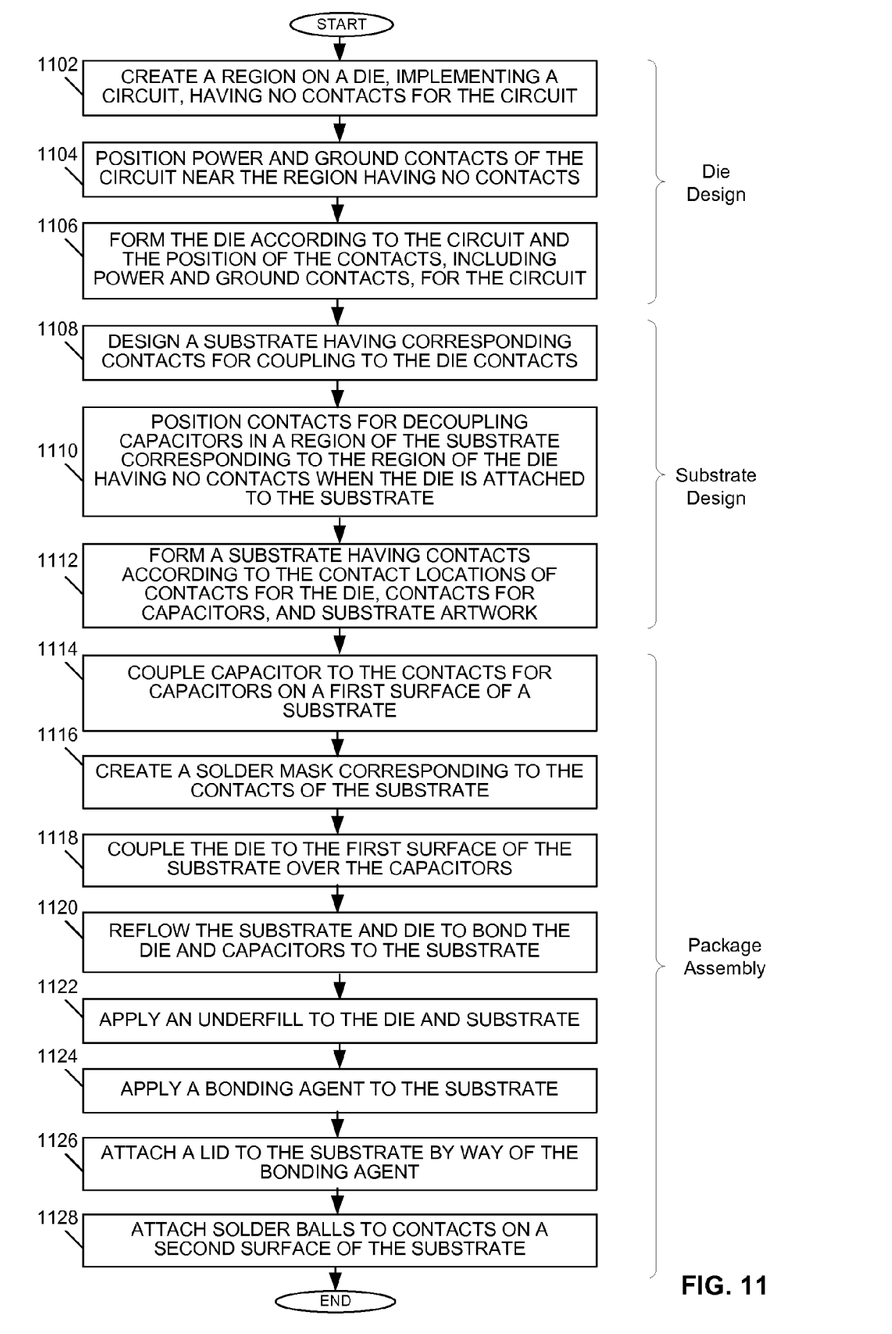
FIG. 11 is a flow chart showing a method of implementing a capacitor in an integrated circuit according to an embodiment the present invention.

Turning now to FIG. 11, a flow chart shows a method of implementing a capacitor in an integrated circuit according to an embodiment the present invention. The method of FIG. 11 may be used to create the integrated circuit packages of FIG. 5 or 6, for example, or some other integrated circuit package. According to one aspect of the method, the design of the integrated circuit package requires consideration of the implementation of a circuit on the integrated circuit die, the layout of the substrate, and the assembly of the integrated circuit package. Each of the various considerations will be described. A region on a die which implements a circuit is created having no contacts for the circuit at a step 1102. Power and ground contacts of the circuit are positioned near the region of the die having no contacts at a step 1104. The die is formed according to the circuit and the position of the contacts, including power and ground contacts, for the circuit at a step 1106.

A substrate is designed having corresponding contacts for coupling to the contacts of the die at a step 1108. Contacts for decoupling capacitors are positioned in a region of the substrate corresponding to the region of the die having no contacts when the die is attached to the substrate at a step 1110. A substrate having contacts according to the contact locations of contacts for the die, contacts for capacitors, and substrate artwork is formed at a step 1112.

A capacitor is coupled to the contacts for capacitors on a first surface of a substrate at a step 1114. A solder mask corresponding to the contacts of the substrate is created at a step 1116. Alternatively, the solder mask could be applied before the capacitors are attached to the substrate, as described above in reference to FIG. 6. The die is coupled to the first surface of the substrate over the capacitors at a step 1118. The solder is reflowed to bond the die and capacitors to the substrate at a step 1120. An underfill is applied to the die and substrate at a step 1122. A bonding agent is applied to the substrate and/or die at a step 1124. A lid is attached to the substrate by way of the bonding agent at a step 1126. Solder balls are attached to contacts on a second surface of the substrate at a step 1128.

The circuits and methods described above provide a number of advantages over conventional designs. For example, the positioning of decoupling capacitors under the die provides better electrical performance due to shorter conductive paths between the decoupling capacitors and the power/ground bumps of the integrated circuit die. Because the top layer substrate design and solder mask openings are created based upon the layout of the integrated circuit die so that the chip capacitors are placed near power and ground contacts of the integrated circuit die, the simultaneous switching noise (SSO) between the power & ground planes is minimized compared to designs. By using high-Pb solder bumps, an increased stand-off height over eutectic bumps is achieved. That is, since high-Pb bumps do not melt during assembly reflow process, a separation is maintained between the integrated circuit die and the capacitors on the substrate. Accordingly, the capacitors are protected during the entire package assembly process and the board mount process. The circuits and methods also provide an improved packaging efficiency by removing the capacitors from periphery of the substrate, thus allowing increased area for attaching the lid to the substrate or reducing the overall size of the integrated circuit package.

It can therefore be appreciated that the new and novel circuit for and method of implementing a capacitor on an integrated circuit package has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. A method of implementing at least two capacitors in an integrated circuit package, the method comprising:
   coupling the capacitors laterally side by side to a first flat surface of a substrate of the integrated circuit package;
   positioning an integrated circuit die over the capacitors, wherein the integrated circuit die has a first plurality of solder bumps and a second plurality of solder bumps separated by a region having no solder bumps;
   connecting the integrated circuit die to the first flat surface of the substrate over the capacitors, wherein the region having no solder bumps is positioned directly over the capacitors, and the integrated circuit die is connected to the first flat surface of the substrate by using the first plurality of solder bumps and the second plurality of solder bumps that are physically on the flat surface of the substrate; and
   attaching a lid to the substrate for encapsulating the integrated circuit die and the capacitors.

2. The method of claim 1 wherein connecting the integrated circuit die to the first flat surface of the substrate over the capacitors comprises positioning a bus having power and ground conductors over the capacitors.

3. The method of claim 1 further comprising creating a region of the substrate having the capacitors and corresponding to the region of the integrated circuit die having no solder bumps when the integrated circuit die is coupled to the substrate.

4. The method of claim 1 further comprising applying a solder mask layer over the capacitors.

5. The method of claim 1 further comprising applying a solder mask layer to the substrate, wherein coupling the capacitors to the first flat surface of the substrate comprises coupling the capacitors through an opening in the solder mask layer.

6. The method of claim 1 wherein coupling the capacitors to the first flat surface of the substrate comprises coupling the capacitors to a power plane or a ground plane of the substrate.

7. The method of claim 1 wherein attaching the lid to the substrate comprises applying a bonding agent to the substrate.

8. A method of implementing at least two capacitors in an integrated circuit package, the method comprising:
   coupling the capacitors laterally side by side to a first flat surface of a substrate of the integrated circuit package;
   positioning a flip chip die physically on a first plurality of solder bumps and a second plurality of solder bumps separated by a region of the flip chip die having no solder bumps, wherein the first plurality of solder bumps and the second plurality of solder bumps are physically on the substrate, the plurality of solder bumps creating a first separation between a bottom of the flip chip die and the capacitors, wherein the region of the flip chip die having no solder bumps is positioned directly over the capacitors;
   reflowing the plurality of solder bumps during an assembly reflow process; and
   maintaining a second separation between the bottom of the flip chip die and the capacitors after reflowing the plurality of solder bumps.

9. The method of claim 8 further comprising applying a solder mask layer over the capacitors.

10. The method of claim 8 wherein coupling the capacitors to the first flat surface of the substrate comprises coupling the capacitors to conductors of the substrate through an opening in a solder mask layer.

11. The method of claim 8 wherein coupling the capacitors to the first flat surface of the substrate comprises positioning the capacitors near a power contact or a ground contact of the substrate.

12. The method of claim 8 wherein maintaining the second separation between the bottom of the flip chip die and the capacitors comprises maintaining the second separation using a solder mask layer on top of the capacitors.

13. The method of claim 8 wherein the region of the flip chip die having no solder bumps corresponds to a region of the substrate for receiving the capacitors.

14. The method of claim 8 wherein maintaining the second separation between the bottom of the flip chip die and the capacitors comprises maintaining the second separation after reflowing the plurality of solder bumps which is less than the first separation before reflowing the plurality of solder bumps.

15. A method of implementing at least two capacitors in an integrated circuit package, the method comprising:
   coupling the capacitors laterally side by side to a first flat surface of a substrate of the integrated circuit package;
   positioning an integrated circuit die over the capacitors, wherein the integrated circuit die has a bus having power and ground conductors extending along a region of the integrated circuit die having no solder bumps;
   connecting the integrated circuit die to the first flat surface of the substrate over capacitors, wherein the region of the integrated circuit die having no solder bumps is positioned directly over the capacitors, and the integrated circuit die is connected to the first flat surface of the substrate by using a first plurality of solder bumps and a second plurality of solder bumps that are physically on the flat surface of the substrate; and
   encapsulating the integrated circuit die and the capacitors.

16. The method of claim 15 wherein positioning the integrated circuit die over the capacitors comprising positioning the first plurality of solder bumps on a first side of the capacitors and positioning the second plurality of solder bumps of integrated circuit die on a second side of the capacitors opposite to the first side.

17. The method of claim 15 further comprising creating a region of the substrate having the capacitors and corresponding to the region of the integrated circuit die having no solder bumps when the integrated circuit die is coupled to the substrate.

18. The method of claim 15 further comprising applying a solder mask layer over the capacitors.

19. The method of claim 15 further comprising applying a solder mask layer to the substrate, wherein coupling the capacitors to the first flat surface of the substrate comprises coupling the capacitors through an opening in the solder mask layer.

20. The method of claim 15 wherein coupling the capacitors to the first surface of the substrate comprises coupling the capacitors to a power plane or a ground plane of the substrate.

* * * * *